United States Patent
Couleur et al.

(10) Patent No.: US 11,171,563 B2
(45) Date of Patent: Nov. 9, 2021

(54) PHASE REGULATION IN A PEAK CURRENT MODE POWER CONVERTER

(71) Applicant: Apple Inc., Cupertino, CA (US)

(72) Inventors: Michael Couleur, Rottach Egern (DE); Yesim Inam, Munich (DE); Dashun Xue, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/399,290

(22) Filed: Apr. 30, 2019

(65) Prior Publication Data

US 2020/0350819 A1    Nov. 5, 2020

(51) Int. Cl.
| | | |
|---|---|---|
| *H02M 3/158* | (2006.01) | |
| *H02M 3/157* | (2006.01) | |
| *G05F 1/46* | (2006.01) | |
| *H03K 5/24* | (2006.01) | |
| *H02M 1/00* | (2006.01) | |

(52) U.S. Cl.
CPC ............ *H02M 3/158* (2013.01); *G05F 1/462* (2013.01); *H02M 3/157* (2013.01); *H03K 5/24* (2013.01); *H02M 1/0003* (2021.05)

(58) Field of Classification Search
CPC ............ H02M 3/157; H02M 3/33515; H02M 2001/0003; H02M 3/1582
See application file for complete search history.

(56) References Cited

U.S. PATENT DOCUMENTS

| | | | |
|---|---|---|---|
| 7,109,691 B2 | 9/2006 | Brooks et al. | |
| 7,923,974 B2 | 4/2011 | Martin et al. | |
| 9,041,363 B2 | 5/2015 | Tanabe | |
| 9,413,234 B2 | 8/2016 | Tomasz et al. | |
| 10,222,814 B1 | 3/2019 | Chakraborty et al. | |
| 2008/0061758 A1* | 3/2008 | Nishida | H02M 3/156 323/284 |
| 2010/0327836 A1* | 12/2010 | Li | H02M 3/1588 323/283 |
| 2012/0038331 A1* | 2/2012 | Wu | H02M 3/1588 323/235 |
| 2012/0169255 A1* | 7/2012 | Giussani | H05B 41/2853 315/307 |
| 2013/0002223 A1* | 1/2013 | Xi | H02M 3/158 323/284 |
| 2016/0301307 A1* | 10/2016 | Huang | H02M 3/156 |
| 2019/0013731 A1 | 1/2019 | Gritti | |

OTHER PUBLICATIONS

International Search Report and Written Opinion in PCT Appl. No. PCT/US20/30379 dated Aug. 7, 2020, 17 pages.

\* cited by examiner

*Primary Examiner* — Thienvu V Tran
*Assistant Examiner* — Bart Iliya
(74) *Attorney, Agent, or Firm* — Kowert, Hood, Munyon, Rankin & Goetzel, P.C.

(57) ABSTRACT

A power converter circuit that includes a switch node coupled to a regulated power supply node via an inductor may, during a discharge cycle, sink current from the regulated power supply node. A control circuit may generate the rising and falling ramp signals using voltage levels of an input power supply node and the regulated power supply node. The control circuit may also determine a duration of the discharge cycle using results of comparing respective voltage levels of the generated rising and falling ramp signals.

18 Claims, 8 Drawing Sheets

PHASE REGULATION IN A PEAK CURRENT MODE POWER CONVERTER

BACKGROUND

Technical Field

Embodiments described herein relate to integrated circuits, and more particularly, to techniques for generating regulated power supply voltages.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generated regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments of a power converter circuit are disclosed. Broadly speaking, a power converter circuit is contemplated, in which a switch node is coupled to a regulated power supply node via an inductor. A voltage regulator circuit may be configured to sink a current from the switch node during a discharge cycle. A control circuit may be configured, in response to an initiation of a discharge cycle, generate a falling ramp signal whose initial voltage level is the same as a voltage level of an input power supply signal. The control circuit may be further configured to generate a rising ramp signal using a reference clock. An initial voltage level of the rising ramp signal may be the same as the voltage level of the switch node. The control circuit may be also be configured to halt the discharge cycle using results of a comparison of respective voltage levels of the falling ramp signal and the rising ramp signal. In another non-limiting embodiment, the control circuit may include a first capacitor coupled the input power supply node, and the control circuit may be further configured to generate a first current whose value is proportional to a voltage level of the regulated power supply node and discharge the first capacitor using the first current.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuit that includes both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such converter circuits include multiple devices and a switch node that is coupled to a regulated power supply node via an inductor. Particular devices are then activated to periodically charge and discharge the switch node in order to maintain a desired voltage level on power supply node.

To determine the duration of either the charge cycle or discharge cycle, a feedback loop may be employed. Such feedback loops compare ramp signals whose characteristics are based on operating parameters of the power converter circuit, and based on results of the comparison, halt either the charge or discharge cycle. In some cases, current being sourced to the load through the inductor is measured during a charge cycle (referred to as "peak control"), while in other cases, the current being sunk from the load through the inductor is measured during a discharge cycle (referred to as "valley control").

In some computer systems, multiple power converter circuits may be employed. In such cases, the multiple power converter circuits may share input power supply and grounds supply nodes. To prevent switching noise from one power converter circuit coupling into another power converter circuit, a phase difference in the operation of individual ones of the power converter circuits should be maintained.

To provide the phase control for the multiple power converter circuits, individual power converter circuits may be separately clocked. When such a technique is employed, the power converter circuits may not be able to provide a desired response to transients in the load. Another technique for maintaining a desired phase relationship between the power converter circuits includes implementing a variable charge (or discharge) time system in conjunction with a phase-locked loop system. In many the phase-locked loop may include two poles and be difficult to stabilize and require tens of cycles to lock.

The embodiments illustrated in the drawings and described below may provide techniques for operating a power converter circuit using a phase-locked loop system with a reduced loop gain. By using such a phase-locked loop system, stability of the system is improved and the number of cycles needed to lock is reduced, thereby improving phase alignment between different converter circuits as well as transient load response.

Figure 1:
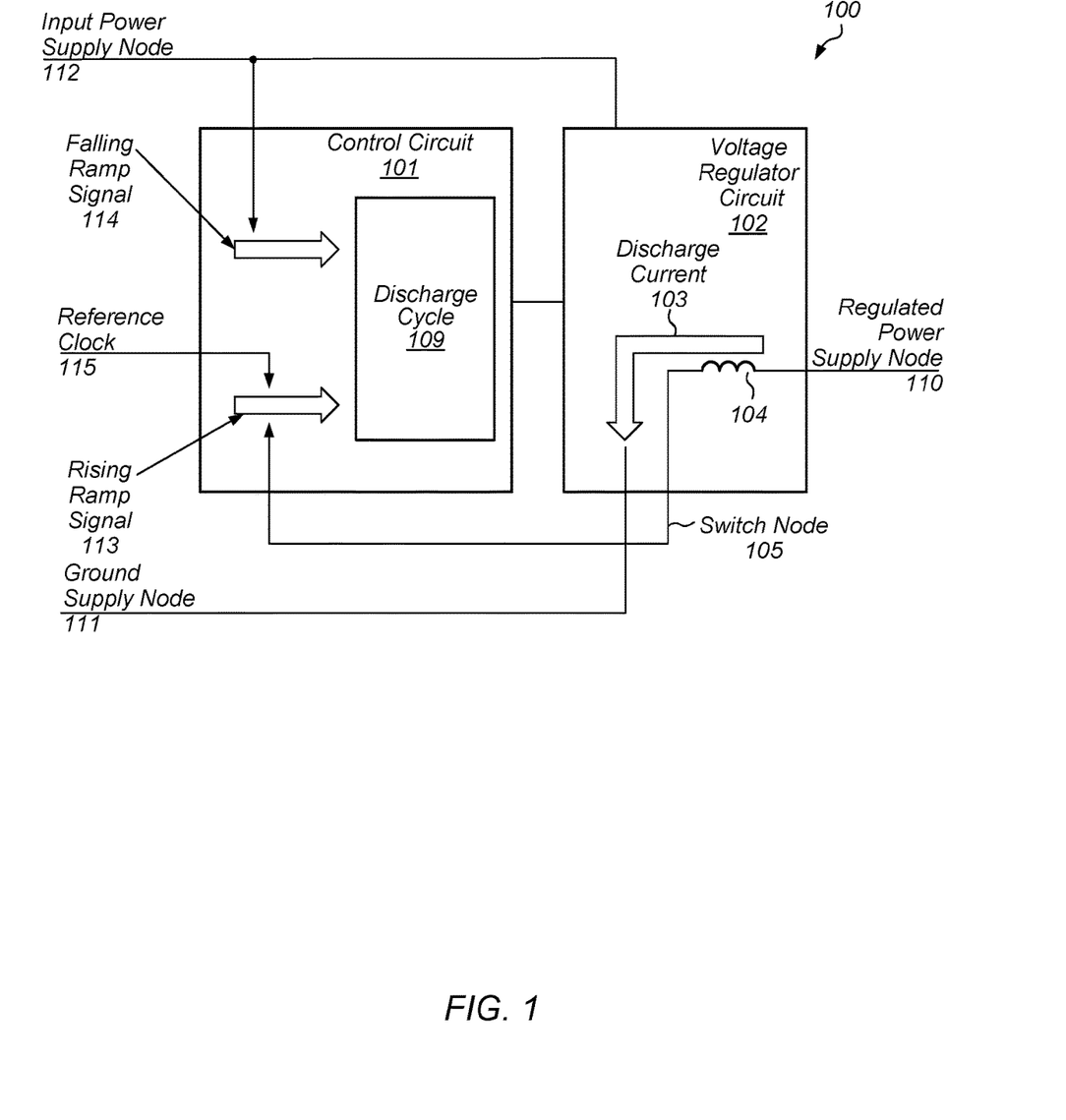
FIG. 1 illustrates a block diagram of an embodiment of a power converter circuit.

A block diagram depicting an embodiment of a power converter circuit is illustrated in FIG. 1. As illustrated, power converter circuit 100 includes control circuit 101 and voltage regulator circuit 102.

Voltage regulator circuit 102 includes switch node 105 coupled to regulated power supply node 110 via inductor 104. In various embodiments, voltage regulator circuit 102 is configured, in response to an initiation of discharge cycle 109, to discharge switch node 105 into ground supply node 111. It is noted that although a single voltage regulator circuit is depicted in the embodiment of FIG. 1, in other embodiments, multiple voltage regulator circuits (collectively "phase units" or "phase circuits") may be coupled to regulated power supply node 110, in parallel, and operated with different timings (or "phases").

As noted above, the duration of charge and discharge cycles in a power converter circuit may be determined using ramp signals that are generated to mimic the behavior of certain electrical characteristic, e.g., inductor current, of a power converter circuit. As illustrated in FIG. 1, control circuit 101 is configured, in response to an initiation of a discharge cycle, to generate a falling ramp signal whose initial voltage level is the same as a voltage level of an input power supply node. As described below in more detail, control circuit 101 may initiate the discharge cycle based, at least in part, on a comparison of a voltage level of the switch node and a reference voltage level. As using herein, a falling ramp signal refers to a signal whose voltage level decreases over a particular period of time.

In addition to generating a falling ramp signal, control circuit 101 is further configured to generate a rising ramp signal using a reference clock signal. An initial voltage level of the rising ramp signal may be the same as a voltage level of the switch node. In embodiments that employ multiple power converter circuits, each power converter circuit may use a different reference block signal. As used herein a rising ramp signal is a signal whose voltage level increases over a particular time period.

To adjust the duration of the discharge cycle, control circuit 101 is also configured to halt the discharge cycle using results of a comparison of respective voltage levels of the falling ramp signal and the rising ramp signal. As described below in more detail, control circuit 101 may be further configured to amplify a difference between the voltage level of the falling ramp signal and the voltage level of the rising ramp signal. By using results of comparing the two ramp signals, with the aforementioned starting voltage levels, the number of cycles needed to achieve a locked state for power converter circuit 100 may be reduced.

Figure 2:
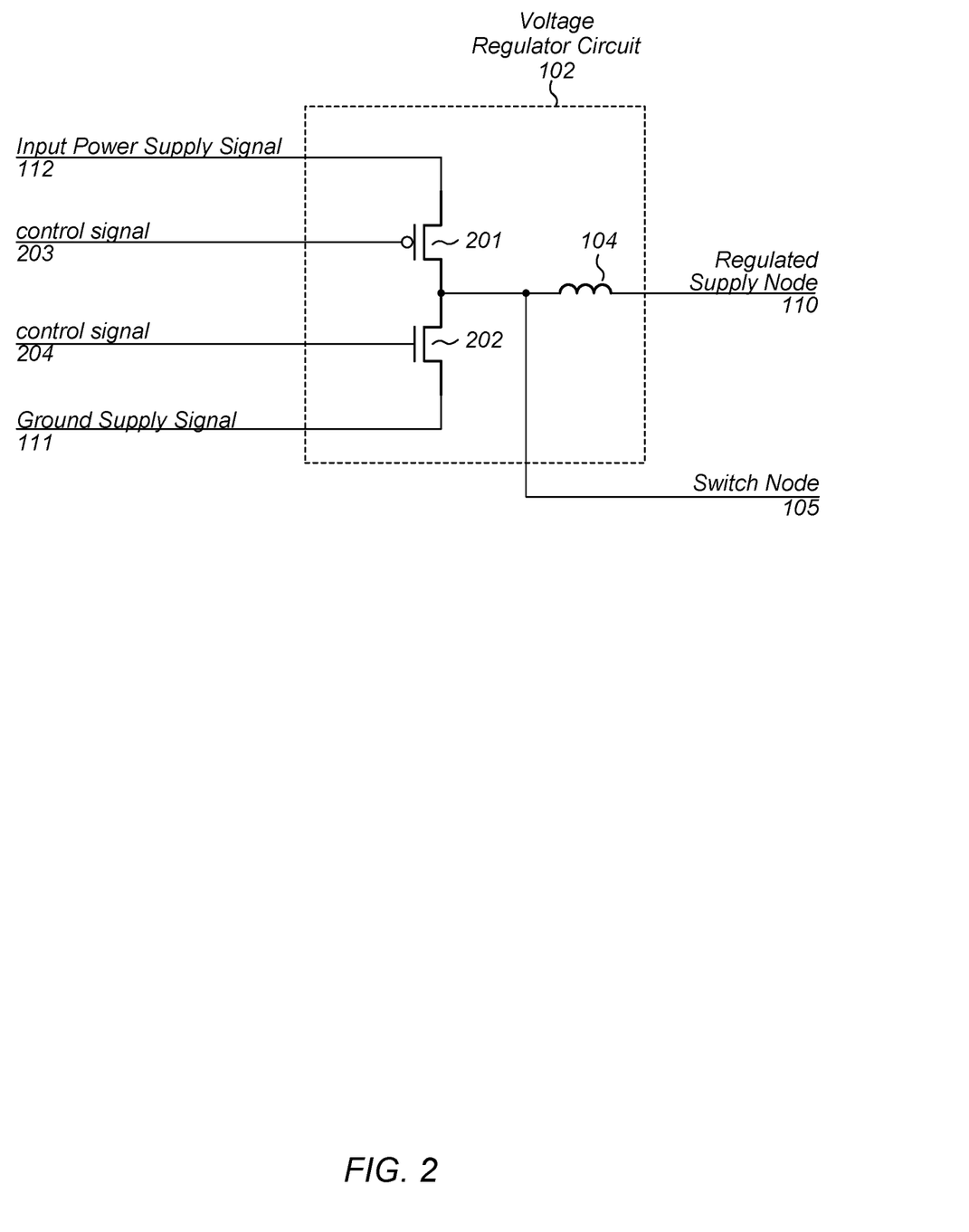
FIG. 2 illustrates schematic diagram of an embodiment of a regulator unit.

A schematic diagram of voltage regulator circuit 102 is depicted in FIG. 2. As illustrated, voltage regulator circuit 102 includes devices 201 and 202, which are both coupled to switch node 105, and controlled by control signals 203 and 204, respectively.

In various embodiments, control circuit 101 may generate control signals 203 and 204. Each of control signals 203 and 204 is used to activate a corresponding one of devices 201 and 202 during charge and discharge cycles. During a charge cycle, current is sourced from input power supply node 112 to regulated power supply node 110, and during a discharge cycle, current is sunk from regulated power supply node 110 into ground supply node 111. Alternating between charge and discharge cycles, and adjusting the duration of either of the charge or discharge cycles may maintain a desired voltage level maintained on regulated power supply node 110.

Device 201 is coupled between input power supply node 112 and switch node 105, and is controlled by control signal 203. During a charge cycle, control signal 203 is asserted, which activates device 201 and couples input power supply node 112 to switch node 105, thereby charging switch node 105 by allowing a current to flow from input power supply node 112 to switch node 105, and then onto regulated power supply node 110. As used herein, asserting, or an assertion of, a signal refers to setting the signal to a particular voltage level that activates a circuit or device coupled to the signal. The particular voltage level may be any suitable value. For example, in the case where device 201 is p-channel MOSFET, control signal 203 may be set to a voltage at or near ground potential.

Device 202 is coupled between switch node 105 and ground supply node 111, and is controlled by control signal 204. During a discharge cycle, control signal 204 is asserted, which activates device 202 and couples switch node 105 to ground supply node 111, thereby providing a conduction path from regulated power supply node 110 through inductor 104 into ground supply node 111. While device 202 is active, current flows from regulated power supply node 110 into ground supply node 111, decreasing the voltage level of regulated power supply node 110. As described below in more detail, the duration of the discharge cycle may be based on a comparison of respective voltage levels of falling ramp signal 114 and rising ramp signal 113.

Device 201 and device 202 may be particular embodiments of MOSFETs. In particular, device 201 may be a particular embodiment of a p-channel MOSFET and device 202 may be a particular embodiment of an n-channel MOSFET. Although only two devices are depicted in the embodiment of FIG. 2, in other embodiments, any suitable number of devices, coupled in series or parallel, may be employed to achieve particular electrical characteristics (e.g., on-resistance of the devices).

Figure 3:
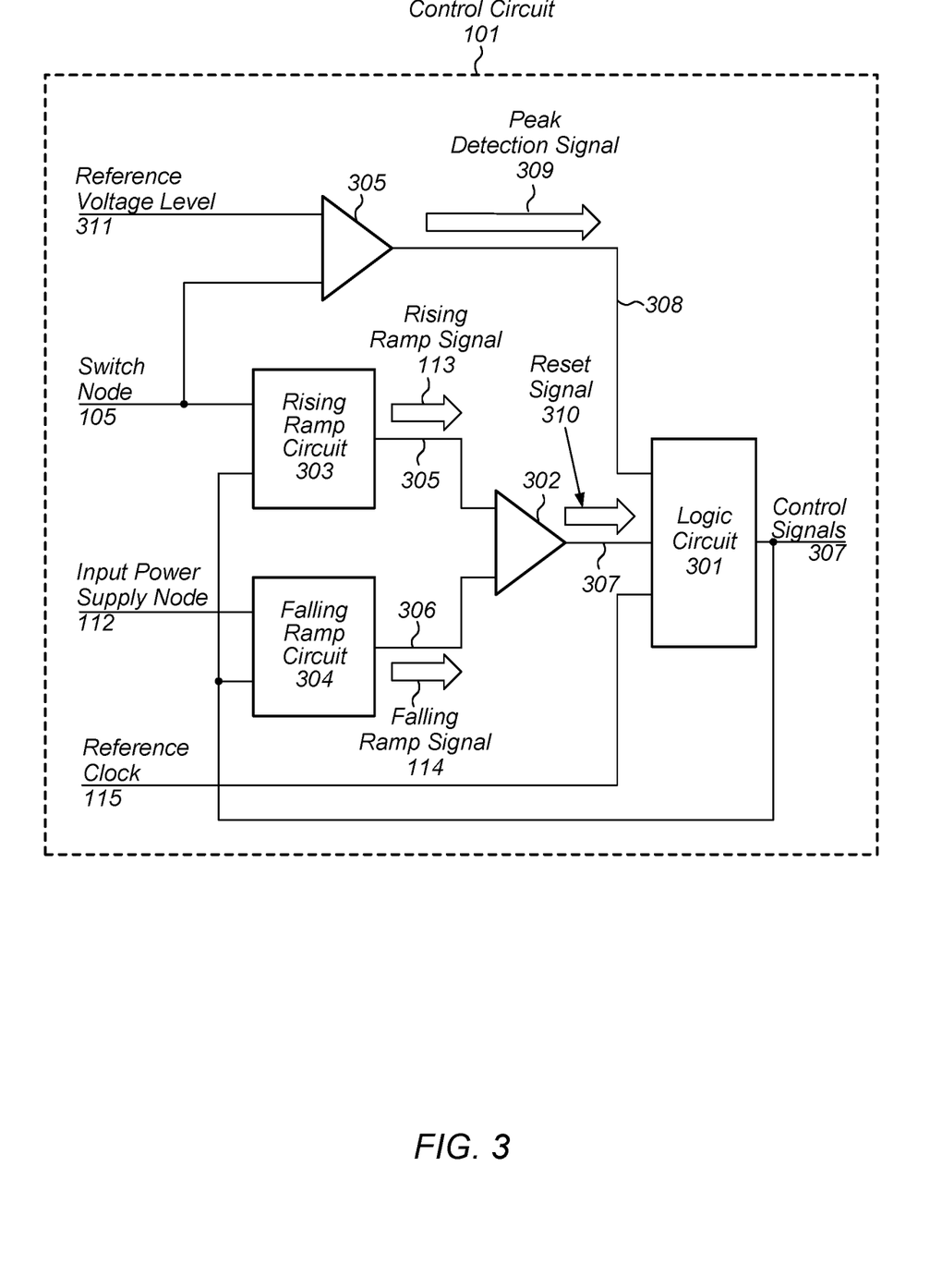
FIG. 3 illustrates a block diagram of an embodiment of a control circuit for a power converter circuit.

A block diagram of an embodiment of control circuit 101 is depicted in FIG. 3. As illustrated, control circuit 101 includes logic circuit 301, comparator circuit 302, rising ramp circuit 303, falling ramp circuit 304, and comparator circuit 312.

Comparator circuit 312 is coupled to reference voltage level 311, switch node 105, and to logic circuit 301 via node 308. In various embodiments, comparator circuit 312 may be a particular embodiment of a differential amplifier configured to generate peak detection signal 309 on node 308. The value of peak detection signal 309 is based on a comparison of reference voltage level 311 and the voltage level of switch node 105.

Rising ramp circuit 303 is coupled to control signals 307, switch node 105 and comparator circuit 302 via node 305, and is configured to generate rising ramp signal 113 on node 305. As described below in more detail, rising ramp circuit 303 may, in various embodiments, include one or more current sources configured to source current to a capacitor in order to generate rising ramp signal. In some embodiments, rising ramp circuit 303 may be configured to pre-charge the capacitor to a voltage level of switch node 105 to provide an initial voltage level of rising ramp signal 113.

Falling ramp circuit 304 is coupled to control signals 307, input power supply node 112 and comparator circuit 302 via node 306, and is configured to generate falling ramp signal 114 on node 306. As described below in more detail, falling ramp circuit 304 may include one or more current sources configured to sink current from a previously charged capacitor in order to generate falling ramp signal 114. In some embodiments, falling ramp circuit 304 may be configured to pre-charge the capacitor to a voltage level of input power supply node 112 to provide an initial voltage level for falling ramp signal 114.

Comparator circuit 302 is coupled to rising ramp circuit 303 and falling ramp circuit 304 via nodes 305 and 306, respectively. Comparator circuit is further coupled to logic circuit 301 via node 313. In various embodiments, comparator circuit 302 may be a particular embodiment of a differential amplifier configured to amplify a difference in respective voltage levels of rising ramp signal 113 and falling ramp signal 114 to generate a reset signal 310 on node 313. In some cases, reset signal 310 is activated in response to a determination that the respective voltage levels of rising ramp signal 113 and falling ramp signal 114 are substantially the same.

Logic circuit 301 may be a particular embodiment of a sequential logic circuit or state machine configured to generate control signals 307 using reference clock signal 115, peak detection signal 309, and reset signal 310. In response to receiving peak detection signal 309, logic circuit 301 may activate one or more of control signals 307 to start a discharge cycle, as well as enable falling ramp circuit 304 to generate falling ramp signal 114. Additionally, logic circuit 301 may be configured, in response to an activation of reference clock signal 115, to activate a different set of control signals 307 to enable rising ramp circuit 303 to generate rising ramp signal 113. As used herein, activation (also referred to herein as assertion) of a signal refers to transitioning the signal to a logic value that enables a particular circuit or action coupled to the signal. In various embodiments, activation of a signal can be transition of the signal to a high or logical-1 value. In such cases, the signal is referred to as being "active high." Alternatively, activation of a signal can be a transition of the signal to a low or logical-0 value (referred to as being "active low").

Figure 4:
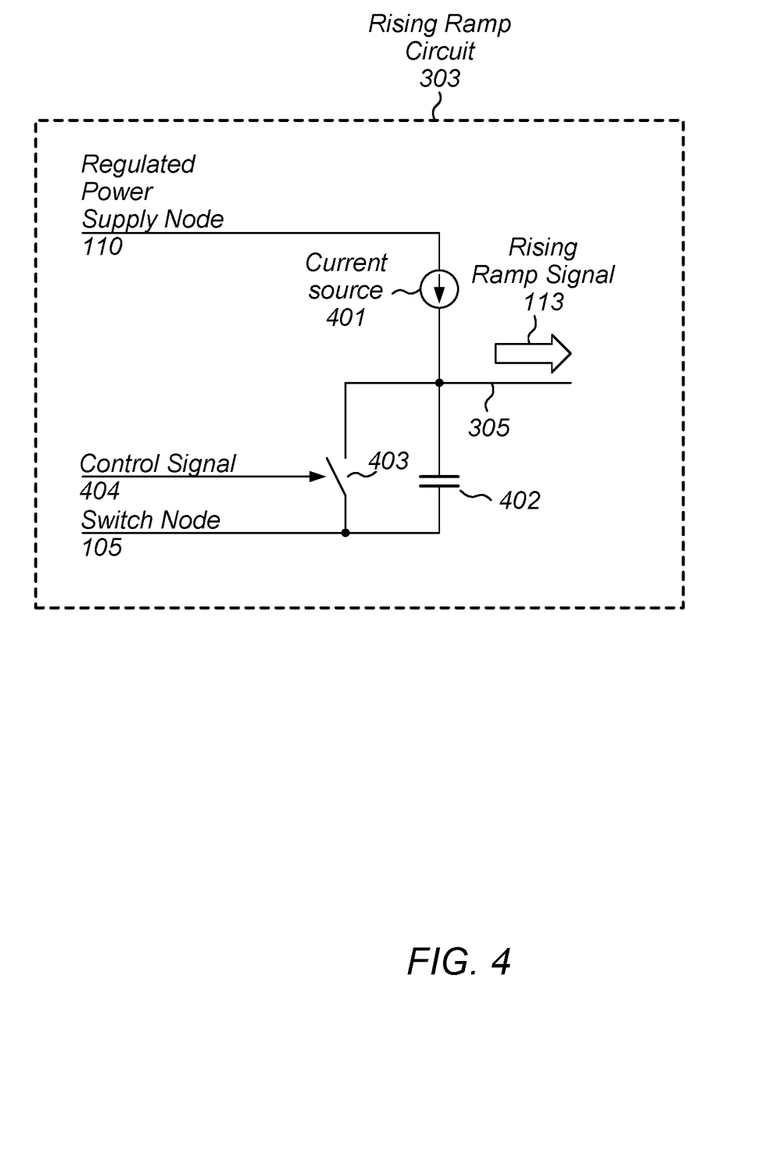
FIG. 4 illustrates a block diagram of an embodiment of a rising ramp generation circuit.

Turning to FIG. 4, a block diagram of an embodiment of rising ramp circuit 303 is depicted. As illustrated, rising ramp circuit 303 includes current source 401, capacitor 402, and switch 403.

Current source 401 is coupled between regulated power supply node 110 and rising ramp signal 113, and is configured to source a current to rising ramp signal 113 and capacitor 402. In various embodiments, a value of the current generated by current source 401 may be proportional a voltage level of regulated power supply node 110 and a voltage level of input power supply node 112.

Current source 401 may be a particular embodiment of transconductance device (e.g., a p-channel MOSFET) whose control voltage is selected to provide a desired current value. In some cases, current source 401 may be included as part of a current mirror or other suitable circuit configured to generate a particular current value.

Capacitor 402 is coupled between rising ramp signal 113 and switch node 105. When switch 403 is closed, capacitor 402 is charged to the voltage level of switch node 105. When switch 403 is open, the voltage level across capacitor 402, and therefore the voltage level of rising ramp signal 113, increases as current source 401 supplies charge to capacitor 402. In various embodiments, capacitor 402 may be fabricated using a metal-oxide-metal structure, or any other suitable structure available on a semiconductor manufacturing process using to fabricate power converter circuit 100.

Switch 403 is configured to couple, based on a value of control signal 404, a rising ramp signal 113 to switch node 105. In various embodiments, control signal 404 may be included in control signals 307 as illustrated in FIG. 3. Switch 403 may be a particular embodiment of a transmission gate or other suitable switch circuit element. In some cases, switch 403 may include one or more MOSFETs or other suitable transconductance devices. Although FIG. 4 depicts a single control signal, i.e., control signal 404, as controlling switch 403, in other embodiments, more than one control signal may be employed.

Figure 5:
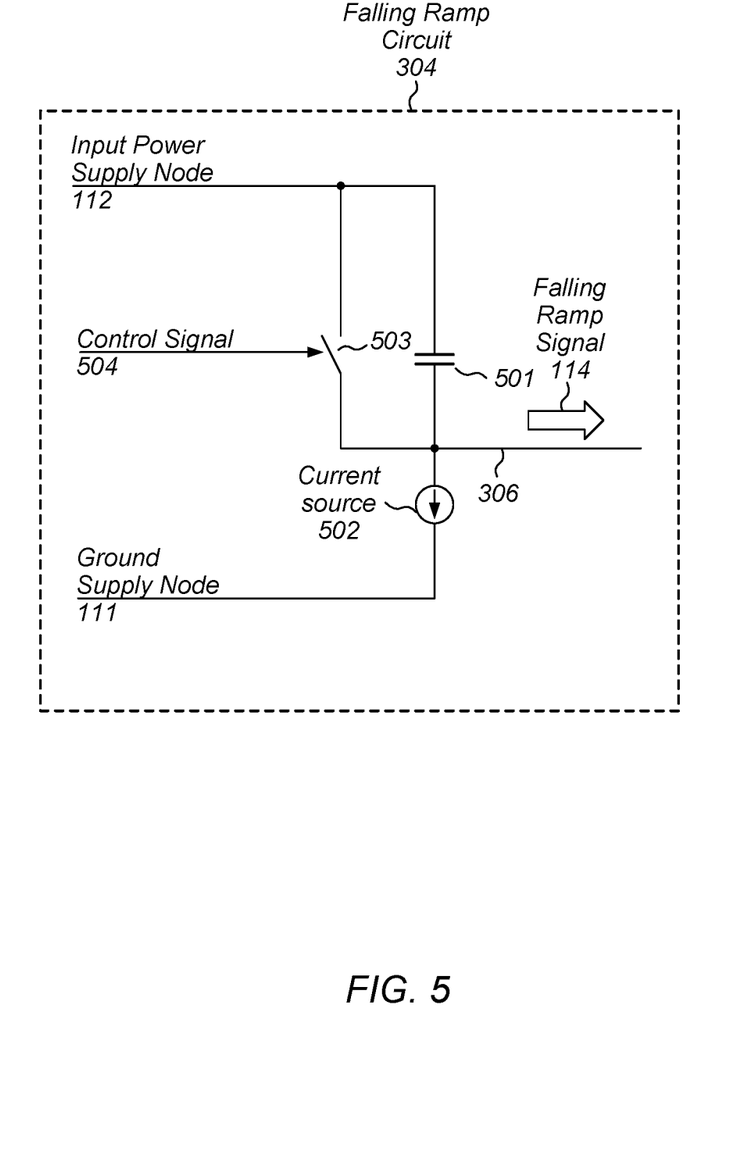
FIG. 5 illustrates a block diagram of an embodiment of a falling ramp generation circuit.

Turning to FIG. 5, a block diagram illustrating an embodiment of falling ramp circuit 304 is depicted. As illustrated, falling ramp circuit 304 includes capacitor 501, current source 502, and switch 503.

Capacitor 501 is coupled between input power supply node 112 and falling ramp signal 114. When switch 503 is closed, falling ramp signal 114 is set to the same voltage level as the voltage level of input power supply node 112, and capacitor 501 is charge to the voltage level of input power supply node 112. When switch 503 is open, capacitor 501 is discharge by current source 502, generating a decreasing voltage level on falling ramp signal 114. In various embodiments, capacitor 501 may be fabricated using a metal-oxide-metal structure, or any other suitable structure available on a semiconductor manufacturing process using to fabricate power converter circuit 100.

Current source 502 may be a particular embodiment of transconductance device (e.g., a n-channel MOSFET) whose control voltage is selected to provide a desired current value. In some cases, current source 502 may be included as part of a current mirror or other suitable circuit configured to generate a particular current value.

Switch 503 is configured to couple, based on a value of control signal 504, a falling ramp signal 114 to input power supply node 112. In various embodiments, control signal 504 may be included in control signals 307 as illustrated in FIG. 3. Switch 503 may be a particular embodiment of a transmission gate or other suitable switch circuit element. In some cases, switch 503 may include one or more MOSFETs or other suitable transconductance devices. Although FIG. 5 depicts a single control signal, i.e., control signal 504, as controlling switch 503, in other embodiments, more than one control signal may be employed.

Structures such as those shown in FIGS. 2-5 for generating a regulated power supply signal may be referred to using functional language. In some embodiments, these structures may be described as including "a means for, in response to an initiation of a discharge cycle, generating a falling ramp signal whose initial voltage is the same as a voltage level of an input power supply node," "a means for generating a rising ramp signal using a reference clock signal wherein a voltage level of the rising ramp signal is the same as a voltage level as the switch node," and "a means for halting the discharge cycle using results of a comparison of respective voltage levels of the falling ramp signal and the rising ramp signal."

The corresponding structure for "means for, in response to an initiation of a discharge cycle, generating a falling ramp signal whose initial voltage is the same as a voltage level of an input power supply node" is falling ramp circuit 304 as well as equivalents of this circuit. The corresponding structure of "means for generating a rising ramp signal using a reference clock signal, wherein a voltage level of the rising ramp signal is the same as a voltage level of the switch node" is rising ramp circuit 303 and its equivalents. Logic circuit 301 and comparator circuit 302, and their equivalents are the corresponding structure for "means for halting the discharge cycle using results of a comparison of respective voltage levels of the falling ramp signal and the rising ramp signal."

Figure 6:
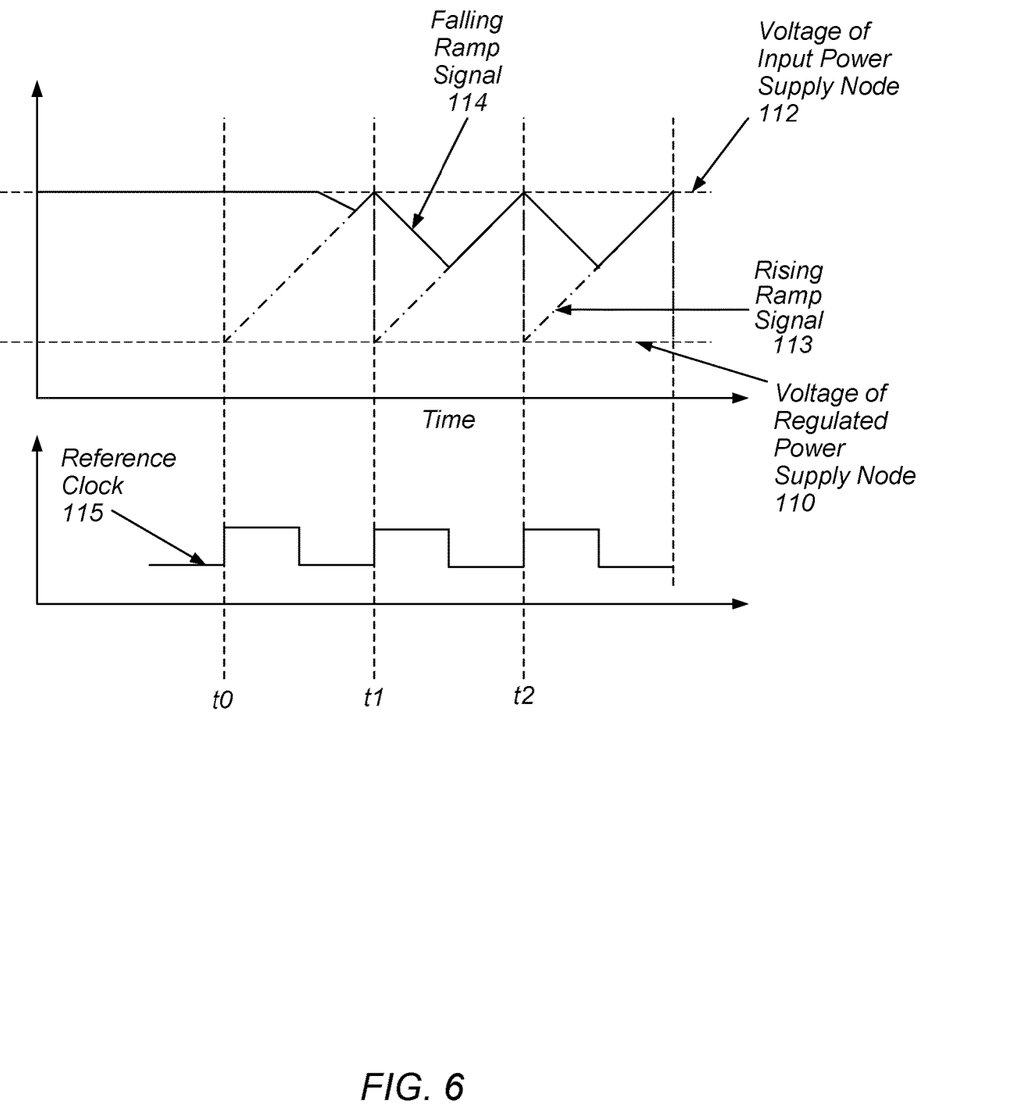
FIG. 6 illustrates sample waveforms from the operation of a power converter circuit.

Sample waveforms associated with the operation of a power converter circuit (e.g., power converter circuit 100) are depicted in FIG. 6. As illustrated, three clock periods are depicted to demonstrate how the control loop of power converter circuit 100 can lock within a few cycles using the techniques disclosed herein.

In the first clock cycle, reference clock signal 115 is activated at time to. The activation of reference clock signal 115 begins rising ramp signal 113 increasing in value from the voltage level of the regulated power supply node 110. At some point during the first clock circuit, a peak is detected in the voltage level of regulated power supply node 110, beginning a decrease in voltage level of falling ramp signal 114 from the voltage level of input power supply node 112. When the voltage levels of rising ramp signal 113 and falling ramp signal 114 are the same, the discharge cycle is halted. As the next clock cycle begins, at time t1, both falling ramp signal 114 and rising ramp signal 113 are pre-charged back to their original levels to be ready for the next clock cycle.

As the control loop of power converter circuit 100 begins to lock, i.e., regulation of the voltage level of regulated power supply node 110 has been achieved, a peak on the voltage level of regulated power supply node 110 is detected sooner within the clock cycle. As depicted in the second cycle, the peak is detected close to time t1, such that both falling ramp signal 114 and rising ramp signal 113 being their transitions at substantially the same time.

In a similar fashion to the first cycle, the discharge cycle ends when the respective voltage levels of falling ramp signal 114 and rising ramp signal 113 are substantially the same. As used herein, when voltage levels are said to be the same or substantially the same, it refers to a situation where the two voltage levels are within some threshold value of each other. For example, two voltage levels may be considered the same if they are within 1 microvolt of each other. Depending on the circuits used, different threshold values may be employed.

The waveforms depicted in the third clock cycle, which beings at time t2, are similar to those in the second clock cycle. It is noted that the waveforms depicted in FIG. 6 are merely example waveforms. Different operating conditions, different component values used in power converter circuit 100, can result in waveforms with a different appearance.

Figure 7:
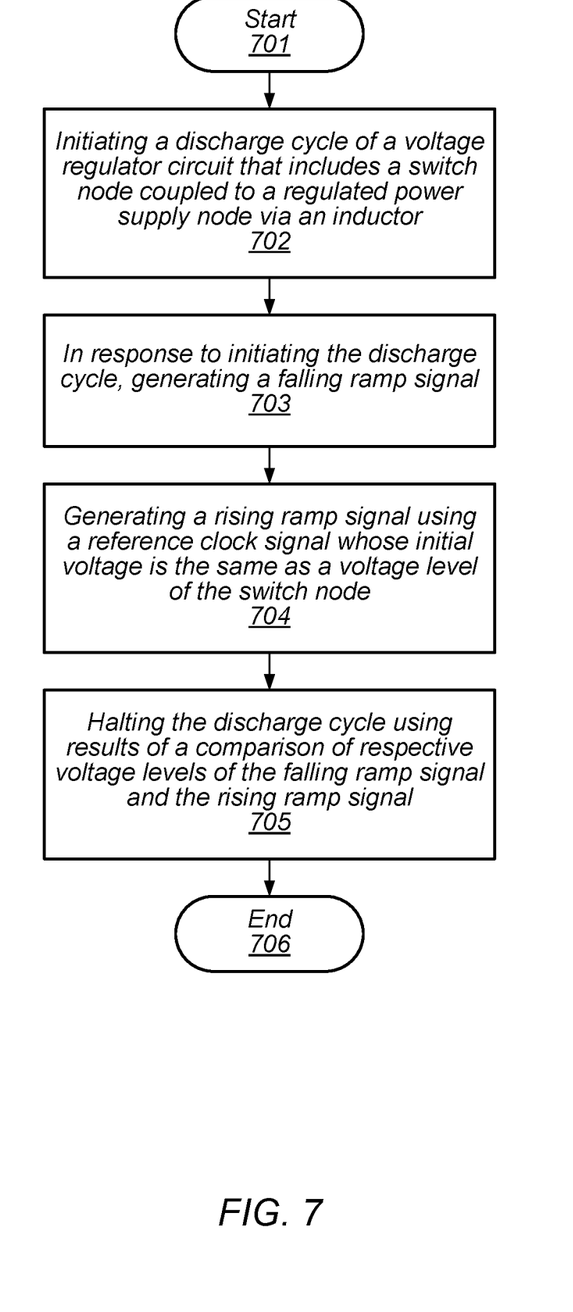
FIG. 7 illustrates a flow diagram depicting an embodiment of a method for operating a power converter circuit.

Turning to FIG. 7, a flow diagram depicting an embodiment of a method for operating a power converter circuit is illustrated. The method, which may be applied to power converter circuit 100 as depicted in FIG. 1, begins in block 701.

The method includes initiating a discharge cycle of a voltage regulator circuit that includes a switch node coupled to a regulated power supply node via an inductor (block 702). In various embodiments, the method may include comparing a voltage level of the regulated power supply node to a reference voltage level and initiating the discharge cycle based, at least in part, on results of comparing the voltage level of the regulated power supply node and the reference voltage level. The method may, in some embodiments, include sinking a discharge current from the switch node into a ground supply node, in response to initiating the discharge cycle. In some cases, the method may also include amplifying, using a comparator circuit, a difference in the voltage level of the falling ramp signal and the voltage level of the rising ramp signal.

In response to initiating the discharge cycle, the method includes generating a falling ramp signal (block 703). In various embodiments, generating the falling ramp signal may include generating a first current whose value is proportional to the voltage level of the regulated power supply node, and discharging a first capacitor that is coupled between the first input of the comparator circuit and the input power supply node using the first current.

The method also includes generating a rising ramp signal using a reference clock signal whose initial voltage level is the same as a voltage level of the switch node (block 704). In some embodiments, generating the rising ramp signal may include generating a second current whose value is proportional to a difference between a voltage level of an input power supply node and the voltage level of the switch node, and charging a second capacitor that is coupled between a second input of the comparator circuit and the switch node using the second current.

The method further includes halting the discharge cycle using results of a comparison of respective voltage levels of the falling ramp signal and the rising ramp signal (block 705). In various embodiments, the method may further include, in response to halting the discharge cycle, coupling the second input of the comparator circuit to the switch node and coupling the first input of the comparator circuit to the input power supply node. The method concludes in block 706.

Figure 8:
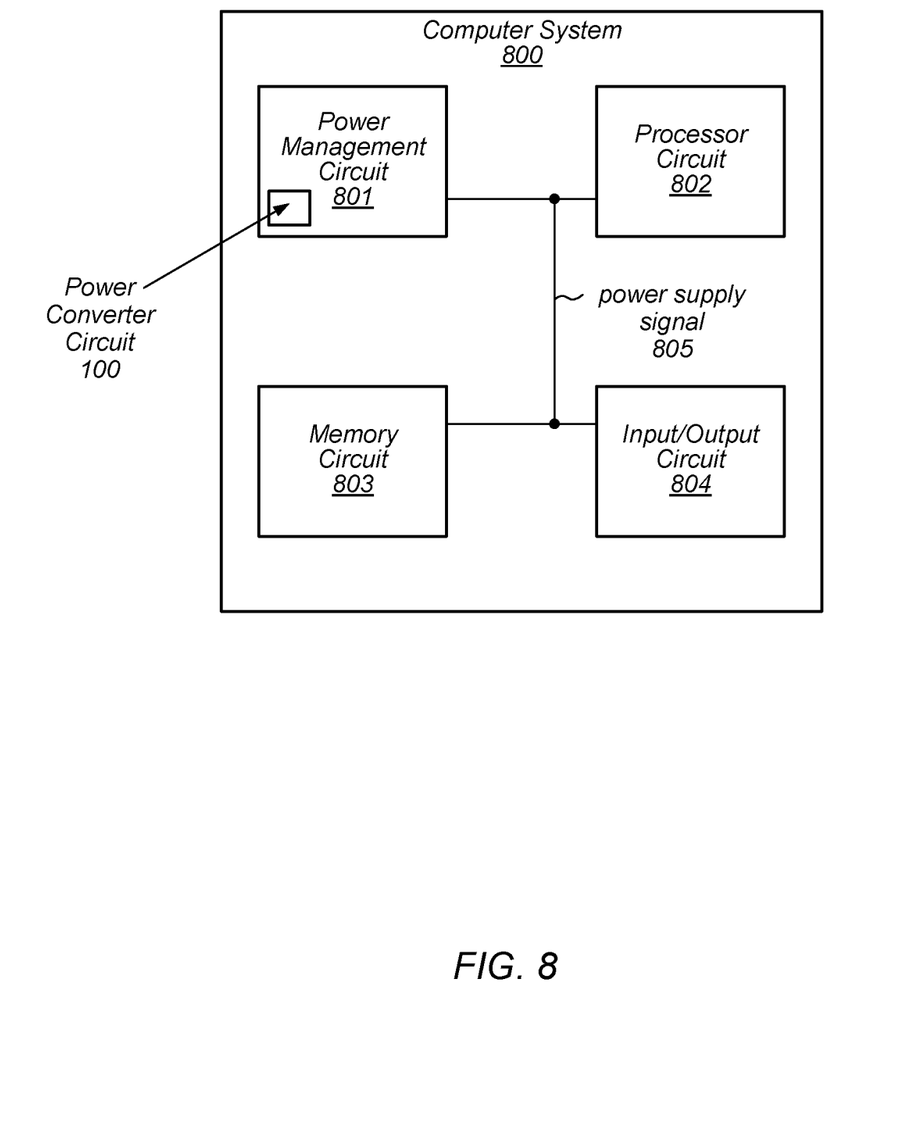
FIG. 8 depicts a block diagram of a computer system.

A block diagram of computer system is illustrated in FIG. 8. In the illustrated embodiment, the computer system 800 includes power management circuit 801, processor circuit 802, memory circuit 803, and input/output circuits 804, each of which is coupled to power supply signal 805. In various embodiments, computer system 800 may be a system-on-a-chip (SoC) and/or be configured for use in a desktop computer, server, or in a mobile computing application such as, e.g., a tablet, laptop computer, or wearable computing device.

Power management circuit 801 includes power converter circuit 100 which is configured to generate a regulated voltage level on power supply signal 805 in order to provide power to processor circuit 802, memory circuit 803, and input/output circuits 804. Although power management circuit 801 is depicted as including a single power converter circuit, in other embodiments, any suitable number of power converter circuits may be included in power management circuit 801, each configured to generate a regulated voltage level on a respective one of multiple internal power supply signals included in computer system 800. In cases where multiple power converter circuits are employed, two or more of the multiple power converter circuits may be connected to a common set of power terminals that connections to power supply signals and ground supply signals of computer system 800.

Processor circuit 802 may, in various embodiments, be representative of a general-purpose processor that performs computational operations. For example, processor circuit 802 may be a central processing unit (CPU) such as a microprocessor, a microcontroller, an application-specific integrated circuit (ASIC), or a field-programmable gate array (FPGA).

Memory circuit 803 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 8, in other embodiments, any suitable number of memory circuits may be employed.

Input/output circuits 804 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 may also be configured to coordinate data transfer between computer system 800 and one or more devices (e.g., other computing systems or integrated circuits) coupled to computer system 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
  a voltage regulator circuit that includes a switch node coupled to a regulated power supply node via an inductor, wherein the voltage regulator circuit is configured to
    source, to the switch node during a charge cycle, a charge current from an input power supply node; and
    sink, during a discharge cycle, a discharge current from the switch node; and
  a control circuit configured to:
    in response to an initiation of the discharge cycle, generate a falling ramp signal whose initial voltage level is the same as a voltage level of the input power supply node;
    generate a rising ramp signal using a reference clock signal, wherein an initial voltage level of the rising ramp signal is the same as a voltage level of the switch node;
    compare the rising ramp signal and the falling ramp signal to generate a reset signal; and
    halt the discharge cycle using the reset rests signal.

2. The apparatus of claim 1, wherein the control circuit includes a first capacitor coupled to the input power supply node, and wherein the control circuit is further configured to:
  generate a first current whose value is proportional to a voltage level of the regulated power supply node; and
  discharge the first capacitor using the first current.

3. The apparatus of claim 2, wherein the control circuit includes a second capacitor coupled to the switch node, and wherein the control circuit is further configured to:
  generate a second current whose value is proportional to a difference between the voltage level of the input power supply node and the voltage level of the regulated power supply node; and
  charge the second capacitor using the second current.

4. The apparatus of claim 3, wherein the control circuit is further configured, in response to halting the discharge cycle, to:
  couple both terminals of the first capacitor to the input power supply node; and
  couple both terminals of the second capacitor to the switch node.

5. The apparatus of claim 1, wherein the control circuit is further configured to amplify a difference between the voltage level of the rising ramp signal and the voltage level of the falling ramp signal.

6. The apparatus of claim 1, wherein the control circuit is further configured to compare a voltage level of the switch node to a reference voltage level.

7. A method, comprising:
  initiating a discharge cycle of a voltage regulator circuit that includes a switch node coupled to a regulated power supply node via an inductor;
  in response to initiating the discharge cycle:
    generating a first current whose value is proportional to a voltage level of the regulated power supply node;
    discharging a first capacitor using the first current to generate a falling ramp signal, wherein the first capacitor is coupled between a first terminal of a comparator circuit and an input power supply node;
  in response to asserting a reference clock signal, generating a rising ramp signal, wherein an initial voltage level of the falling ramp signal is greater than an initial voltage level of the rising ramp signal;
  comparing the rising ramp signal to the falling ramp signal by amplifying, using the comparator circuit, a difference in a voltage level of the falling ramp signal and a voltage level of the rising ramp signal to generate a reset signal; and
  halting the discharge cycle using the reset signal.

8. The method of claim 7, wherein generating the rising ramp signal includes:
  generating a second current whose value is proportional to a difference between a voltage level of an input power supply node and a voltage level of the regulated power supply node; and
  charging a second capacitor using the second current, wherein the second capacitor is coupled between a second terminal of the comparator circuit and the switch node.

9. The method of claim 8, further comprising, in response to halting the discharge cycle:
  coupling the second terminal of the comparator circuit to the switch node; and
  coupling the first terminal of the comparator circuit to the input power supply node.

10. The method of claim 7, further comprising sinking a discharge current from the switch node into a ground supply node, in response to initiating the discharge cycle.

11. The method of claim 7, wherein initiating the discharge cycle of the voltage regulator circuit includes comparing a voltage level of the switch node to a reference voltage level.

12. An apparatus, comprising:
  a voltage regulator circuit including a switch node coupled to a regulated power supply node via an inductor, wherein the voltage regulator circuit is configured to:
    source a charge current from an input power supply signal to the switch node; and
    sink a discharge current from the switch node in response to an activation of one or more control signals;
  a first ramp circuit configured to generate a falling ramp signal in response to the activation of the one or more control signals, wherein an initial voltage level of the falling ramp signal is the same as a voltage level of the input power supply signal;
  a second ramp circuit configured to generate a rising ramp signal in response to an assertion of a reference clock signal, wherein an initial voltage level of the rising ramp signal is the same as a voltage level of the switch node; and
  a comparison circuit configured to compare the respective voltage levels of the falling ramp signal and the rising ramp signal to generate a reset signal; and
  a logic circuit configured to deactivate the one or more control signals based on the reset signal.

13. The apparatus of claim 12, wherein the first ramp circuit includes a first capacitor and a first switch device configured to couple the first capacitor the input power supply signal in response to a determination that the one or more control signals are deactivated.

14. The apparatus of claim 13, wherein the first ramp circuit further includes a first current source configured to sink a first current from the first capacitor in response to the activation of the one or more control signals, wherein a value of the first current is proportional to the voltage level of the switch node.

15. The apparatus of claim 12, wherein the second ramp circuit includes a second capacitor and a second switch configured to coupled the second capacitor to the regulated power supply node in response to a determination that the reference clock signal is inactive.

16. The apparatus of claim 15, wherein the second ramp circuit further includes a second current source configured to source a second current to the second capacitor, wherein a value of the second current is proportional to a difference between respective voltage levels of the input power supply signal and the switch node.

17. The apparatus of claim 12, further including a comparator circuit configured to compare a voltage level of the switch node to a reference voltage level.

18. The apparatus of claim 12, wherein the voltage regulator circuit is further configured to source a charge current to the switch node in response to an activation of a different one or more control signals.

* * * * *

UNITED STATES PATENT AND TRADEMARK OFFICE
CERTIFICATE OF CORRECTION

PATENT NO. : 11,171,563 B2
APPLICATION NO. : 16/399290
DATED : November 9, 2021
INVENTOR(S) : Michael Couleur et al.

Page 1 of 1

It is certified that error appears in the above-identified patent and that said Letters Patent is hereby corrected as shown below:

In the Claims

Claim 1, Column 10, Line 37, Please delete "to" and substitute "to:".

Claim 1, Column 10, Line 53, Please delete "rests".

Signed and Sealed this
Eighteenth Day of April, 2023

Katherine Kelly Vidal
*Director of the United States Patent and Trademark Office*